United States Patent
Liu et al.

(10) Patent No.: US 10,186,839 B1
(45) Date of Patent: Jan. 22, 2019

(54) LASER WITH PRE-DISTORTED GRATING

(71) Applicant: CISCO TECHNOLOGY, INC., San Jose, CA (US)

(72) Inventors: Chiyu Liu, San Diego, CA (US); Weidong Xie, San Ramon, CA (US); Qiang Wang, Huzhou (CN); Mudasir Ahmad, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/896,968

(22) Filed: Feb. 14, 2018

(51) Int. Cl.
| | |
|---|---|
| H01S 5/00 | (2006.01) |
| H01S 5/12 | (2006.01) |
| H01S 5/022 | (2006.01) |
| H01S 5/02 | (2006.01) |
| H01S 5/323 | (2006.01) |

(52) U.S. Cl.
CPC .......... *H01S 5/1206* (2013.01); *H01S 5/0215* (2013.01); *H01S 5/02236* (2013.01); *H01S 5/02272* (2013.01); *H01S 5/12* (2013.01); *H01S 5/124* (2013.01); *H01S 5/323* (2013.01)

(58) Field of Classification Search
CPC ...... H01S 5/12; H01S 5/02236; H01S 5/1206; H01S 5/124; H01S 5/0215; H01S 5/02272; H01S 5/323
See application file for complete search history.

(56) References Cited

U.S. PATENT DOCUMENTS

| | | | |
|---|---|---|---|
| 6,317,528 B1 | 11/2001 | Gadkaree et al. | |
| 6,510,272 B1 * | 1/2003 | Wiegand ............... | G02B 6/0218 385/136 |
| 6,597,711 B2 * | 7/2003 | Fernald ................ | G02B 6/0218 372/20 |
| 6,845,117 B2 * | 1/2005 | Wakisaka .................. | H01S 5/12 372/46.01 |
| 7,856,888 B2 * | 12/2010 | Ferguson ............... | G01B 11/18 385/13 |
| 2004/0057653 A1 * | 3/2004 | Fukuda .................. | G02B 6/124 385/14 |
| 2016/0363492 A1 | 12/2016 | Yu et al. | |

OTHER PUBLICATIONS

NanoStructures Laboratory, Massachusetts Institute of Technology, "Development of High Speed DFB and DBR Semiconductor Lasers", Oct. 20, 2017.

* cited by examiner

*Primary Examiner* — Kinam Park
(74) *Attorney, Agent, or Firm* — Cindy Kaplan

(57) ABSTRACT

In one embodiment, an apparatus includes a carrier and a semiconductor laser bonded to the carrier, the semiconductor laser comprising a grating extending longitudinally along the semiconductor laser. The grating is pre-distorted to vary a pitch of the grating according to a longitudinal strain profile of the grating to compensate for bonding induced stress such that the grating has a uniform pitch following bonding of the laser to the carrier.

20 Claims, 6 Drawing Sheets

LASER WITH PRE-DISTORTED GRATING

TECHNICAL FIELD

The present disclosure relates generally to lasers, and more particularly, to preventing laser failures due to strain on laser gratings.

BACKGROUND

Silicon photonics is growing rapidly to drive the growth of IoT (Internet of Things), video, and mobile communications. DFB (Distributed Feedback) lasers are key components for silicon photonics. The active region of the device is periodically structured as a diffraction grating. The structure builds a one-dimensional interference grating that provides optical feedback for the laser.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
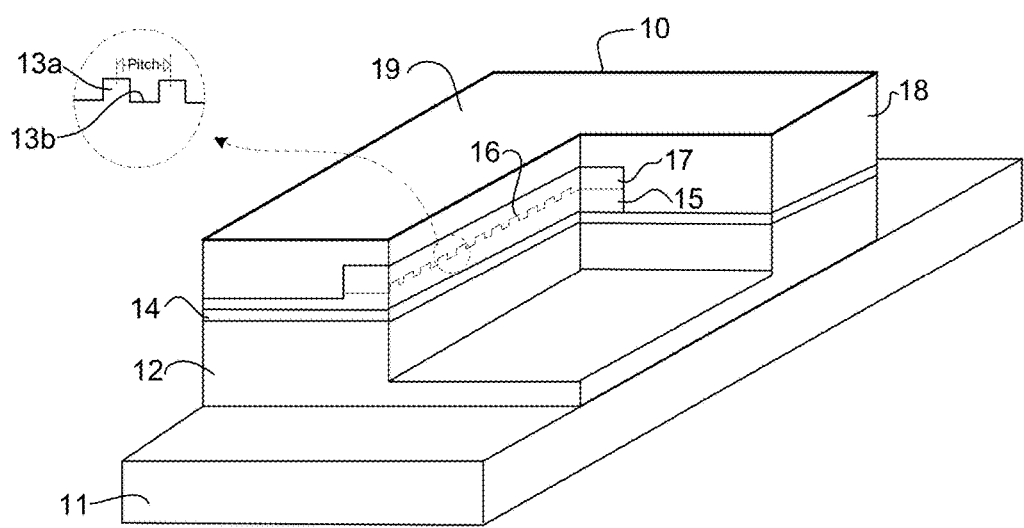
FIG. 1 is a perspective cutaway view of a distributed feedback laser, in accordance with one embodiment.

In one embodiment, an apparatus generally comprises a carrier and a semiconductor laser bonded to the carrier. The semiconductor laser comprises a grating extending longitudinally along the semiconductor laser. The grating is pre-distorted to vary a pitch of the grating according to a longitudinal strain profile of the grating to compensate for bonding induced stress such that the grating has a uniform pitch following bonding of the laser to the carrier.

In another embodiment, a method generally comprises identifying a longitudinal strain profile of a grating for a laser and carrier assembly, defining a pitch variation for the grating to compensate for a strain identified in the longitudinal strain profile, creating a pre-distorted grating according to the defined pitch variation, and bonding the laser to the carrier. The bonded laser and carrier assembly comprise a grating with a uniform grating pitch.

In yet another embodiment, a distributed feedback laser generally comprises a plurality of layers and a grating defined in one of the layers and extending longitudinally along the distributed feedback laser. The grating is pre-distorted to vary a grating pitch according to a longitudinal strain profile of the grating to compensate for bonding induced stress such that the grating has a uniform pitch following bonding of the laser.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

High-speed semiconductor lasers such as DFB (Distributed Feedback) lasers are important for high-speed optical communication links. DFB lasers are single mode lasers that contain an integrated grating structure along the length of the laser in the form of a periodic modulation of the index of refraction and/or gain to provide wavelength selective optical feedback. The grating is constructed to reflect a narrow band of wavelengths and therefore produces a single longitudinal lasing mode. Careful attention needs to be paid to the grating design in high performance lasers because improved grating design can significantly enhance laser performance.

The DFB laser is typically mounted on a carrier (also referred to as a submount) in photonic devices for applications such as high speed optical communications systems. Bonding induced strain on laser gratings may occur after bonding due to a CTE (Coefficient of Thermal Expansion) mismatch between the laser (e.g., InP (Indium Phosphide)) and the submount (e.g., Si (Silicon), AlN (Aluminum Nitride), Cu (Copper)). When the laser die is cooled to room temperature post-bonding, the laser die may bow due to the CTE mismatch of the materials in the laser subassembly. The bow distorts the laser grating, which results in a phase shift of the optical output. The strain on the grating induced by bonding to a submount due to thermal expansion mismatch between the laser and submount may therefore alter the laser's grating pitch and refractive index and perturb laser mode operation.

A laser grating with a uniform grating pitch pre-bonding is distorted by the bonding strain, resulting in a non-uniform grating pitch post-bonding. This causes uncontrollable laser phase shift, resulting in laser kink or multimode operation, which are common failure modes that significantly impact production yield of laser subassemblies. If the phase shift exceeds a certain level, the laser is not acceptable for use. Next generation of silicon photonics may use high power lasers with long cavities, which are more vulnerable to bonding induced strain. In order to enhance production yield, it is important to provide a laser that is not sensitive to grating strain from a laser subassembly.

The embodiments described herein provide a pre-distorted grating to prevent laser kink failures in lasers such as DFB lasers. As described in detail below, the embodiments provide a pre-distorted laser grating with a varied pitch designed according to the grating's longitudinal strain profile such that phase shift induced by bonding stress can be pre-compensated. The engineered laser grating with pre-compensation of bonding stress according to a grating strain profile allows for higher production yield for laser subassemblies in silicon photonic devices.

Referring now to the drawings and first to FIG. 1, a perspective cutaway view of one example of a DFB laser 10 is shown. The laser die 10 is mounted on a carrier (submount) 11. The laser 10 may be bonded to the carrier 11 with Au (Gold)/Sn (Tin) solder, for example. The laser 10 comprises a plurality of layers including a substrate 12 (e.g., n-InP) on which an active layer 14 is disposed. Optical guide (waveguide) layer 15 (e.g., InGaAsP) includes a grating 16 and is followed by a layer 17 (e.g., p-InP). A contact layer 19 for providing an electrical signal to the DFB laser is disposed over layer 18. Each layer 15, 17 has a distinct index of refraction with respect to the other layer. This relative refractive index disparity enables the grating 16 to act as a feedback surface for reflecting light waves and enabling their coherent propagation within the DFB laser.

Figure 2:
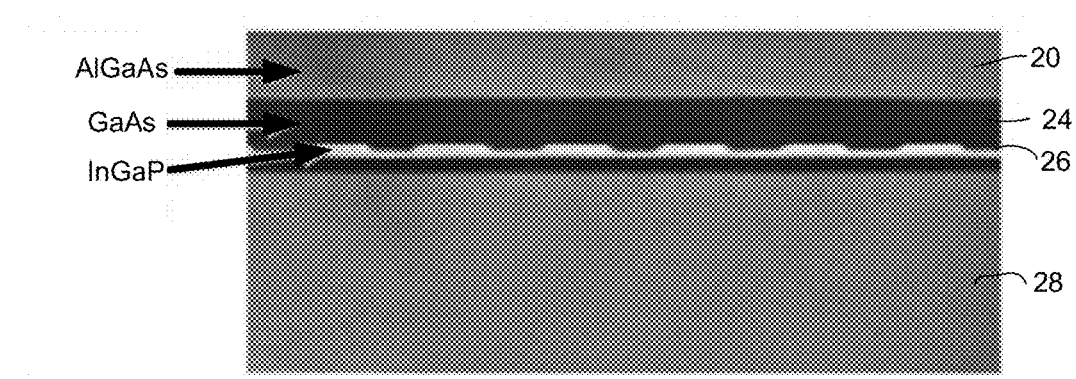
FIG. 2 is a cross-sectional view of the distributed feedback laser, in accordance with one embodiment.

FIG. 2 is a cross-sectional view showing an example of materials that may be used in the laser, in accordance with one embodiment. In this example, the laser comprises an AlGaAs (Aluminum Gallium Arsenide) layer 20, GaAs (Gallium Arsenide) layer 24, and an InGaP (Indium Gallium Phosphide) layer 26. The laser may be formed, for example, on an InP (Indium Phosphide) substrate 28. An InGaAsP (Indium Gallium Arsenide Phosphide) layer may be grown on the InP substrate 28, followed by patterning a diffracting InGaP layer 26 and the GaAs 24 layer grown on the patterned layer. An active layer or layers may be grown in the InP layer 28. It is to be understood that the materials described herein are only examples and other materials may be used without departing from the scope of the embodiments.

Referring again to FIG. 1, the DFB laser 10 incorporates the grating 16 longitudinally along the length of the device in the form of a periodic modulation feedback for single mode operation. The grating 16 comprises a series of grooves that are etched or otherwise defined in the layer 15. The grooves define a series of teeth (fingers, members, elements) 13a protruding from layer 15 and gaps 13b between adjacent teeth. The gaps 13b between the teeth 13a are filled with the layer 17 such that continuous contact is established between layers 15 and 17.

As shown in the enlarged cutaway view, a grating pitch P is defined as the distance between the centerline of adjacent teeth 13a. As described in detail below, the embodiments comprise a grating pitch that is pre-distorted prior to bonding such that the pitch varies along the grating to compensate for strain introduced when the laser 10 is bonded to the carrier 11. After bonding the laser 10 to the carrier 11, the strain causes the pitch to be generally uniform along the length of the laser, as shown in FIG. 1.

The term "pre-distorted grating" as used herein refers to a grating that has a pitch that varies along the length of the grating such that the gap 13b between at least two of the teeth 13a is different than the gap between two or more other teeth (and/or the width of the teeth varies). The term "uniform grating" as used herein refers to a grating that has a pitch that is generally the same along the length of the grating or defined sections of the grating (e.g., all teeth 13a within the grating or predefined section of the grating have substantially the same gap 13b therebetween). For example, a phase-shifted grating may be designed so that different sections of the grating have a different pitch (e.g., one or more teeth 13a have a different width to provide a single wave shift at the center or multiple smaller shifts distributed along the grating) and the gratings are pre-distorted to provide the uniform grating pitch post-bonding within each phase-shifted section of the grating.

The diffraction grating (reflective) element 16 may be embedded, etched, imprinted, or otherwise formed. For example, the grating 16 may be patterned using lithographic techniques or any other suitable process.

Each end facet of the laser 10 comprises a coating, such as an AR (anti-reflective) coating. The AR coating reduces reflection of internal light waves off of end facets during laser operation and allows the light to exit the laser through the end facets. The laser 10 may comprise an AR/HR (high reflective) facet coating with uniform grating or an AR/AR facet coating with phase-shifted gratings, for example. Both are sensitive to grating strain induced by bonding.

It is to be understood that the structures, layers, arrangement, and materials shown in FIGS. 1 and 2 and described above are only examples and that the laser may comprise any number or type of layers in any suitable arrangement and comprising any suitable materials, without departing from the scope of the embodiments. Also, the DFB laser is only an example and the pre-distorted grating described herein may be implemented in any type of semiconductor or optical laser utilizing gratings that are exposed to strain during an assembly or manufacturing process.

Figure 3A:
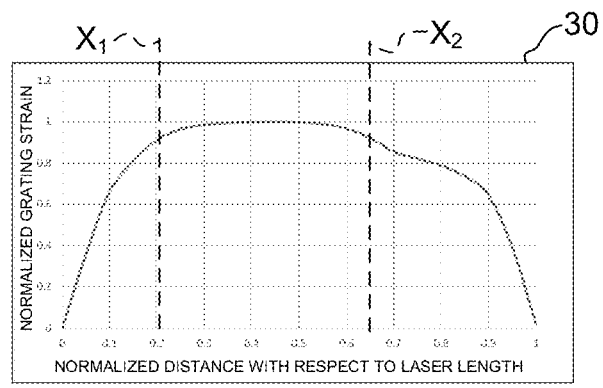
FIG. 3A illustrates an example of a longitudinal strain profile of a grating after bonding.
Figure 3B:
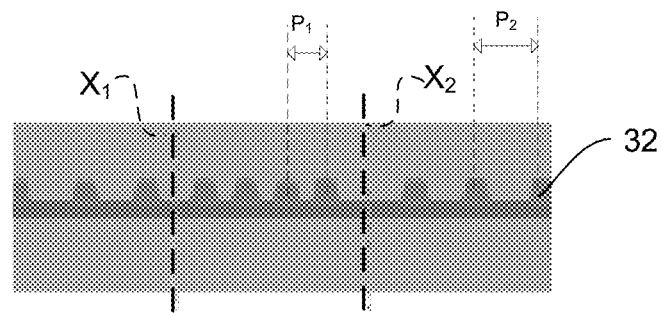
FIG. 3B illustrates a grating that has been pre-distorted prior to bonding to account for non-uniform strain that occurs after bonding.
Figure 3C:
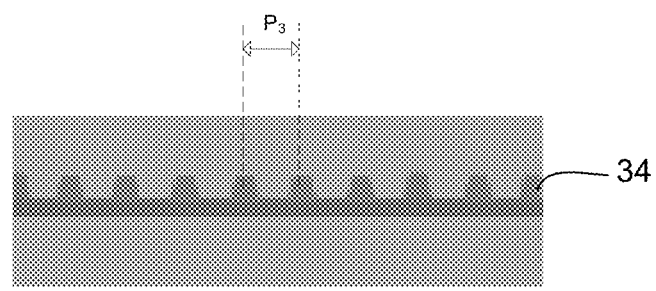
FIG. 3C shows the pre-distorted grating of FIG. 3B after bonding.

As shown in FIGS. 3A-3C, a pre-distorted grating 32 is designed and formed to compensate stress induced by bonding the laser 10 to the carrier 11 (FIG. 1) due to thermal expansion mismatch between the laser and the carrier, as described further below with respect to FIGS. 4A-4C.

Referring to FIG. 3A, a longitudinal strain profile 30 is shown for a grating after bonding. The plot shows a strain (percent strain) on the laser grating at a longitudinal distance ($\mu$m) along the grating and parallel to the bonding surface. In this example, the bonding induced strain perturbation of the Bragg grating was obtained from an FEA (Finite Element Analysis) simulation of bonding strain. The FEA simulation predicts a bonding induced strain that is not uniform along the length of the cavity of a bonded laser. The longitudinal strain profile may be obtained, for example, from FEA simulations, DOP (Degree of Polarization-resolved photoluminescence) measurements on a top surface of the laser, or any other suitable means.

The longitudinal strain profile of the grating may be used to design the pre-distorted grating sections to achieve high yielded DFB laser for both pre-bonding and post-bonding. In one embodiment, a grating pitch profile for the pre-distorted grating may be selected according to the longitudinal strain profile with small adjustments made for design elements to achieve high yield DFB before bonding. Pre-distorted grating sections compensate for perturbation of the grating spacing induced by bonding to provide high yield DFB laser post-bonding. This gives designers significant control and flexibility at little or no disadvantage and at minimal cost to laser fabrication by utilizing different grating pitches (periodicities) for sections controllable by lithography. The pre-distorted grating may be verified using, for example, a probability-amplitude transfer-matrix model (TMM), in which bonding induced strain can be included as perturbation of the grating spacing.

FIG. 3B illustrates an example of a pre-bonding non-uniform grating 32 with a varied grating pitch designed in accordance with the longitudinal strain profile shown in FIG. 3A. The laser grating 32 is designed such that phase shift induced by bonding stress can be pre-compensated. As shown in FIG. 1 and described above, the grating pitch is defined as the distance between two grating elements (i.e., center-to-center distance between two adjacent teeth 13a). As shown in FIG. 3A, there is a section of higher strain between locations $X_1$ and $X_2$. The grating pitch $P_1$ is therefore reduced for a portion of the grating located between $X_1$ and $X_2$ as compared to the pitch $P_2$ for the grating located at end portions of the laser.

FIG. 3C shows the grating of FIG. 3B post-bonding. After bonding, grating 34 has a uniform grating pitch $P_3$ (i.e., generally uniform spacing between teeth for a length of the grating (or section of the grating for phase-shifted gratings)). In this example, the uniform pitch $P_3$ is greater than $P_1$ (pitch at central portion of grating) (FIGS. 3B and 3C). Pre-distorted grating sections compensate perturbation of the grating spacing induced by bonding. The pre-distorted grating pitch $P_1$, $P_2$ of FIG. 3B accounts for the non-uniform strain that leads to bowing (as shown in FIG. 4B and described below) and allows for the grating to reach a uniform pitch $P_3$ after exposure to bonding strains during heating and cooling in the bonding process for the laser and carrier assembly.

It is to be understood that the strain profile, pre-distorted grating pitch, and uniform grating pitch shown in FIGS. 3A-3C are only examples and that various grating pitch profiles may be used in accordance with different strain profiles.

Figure 4A:
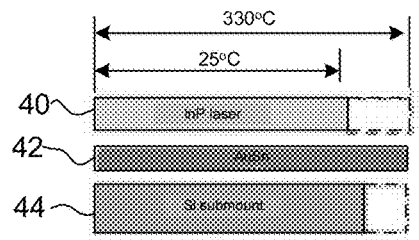
FIG. 4A illustrates expansion of layers of a laser and carrier assembly at a higher temperature.
Figure 4B:
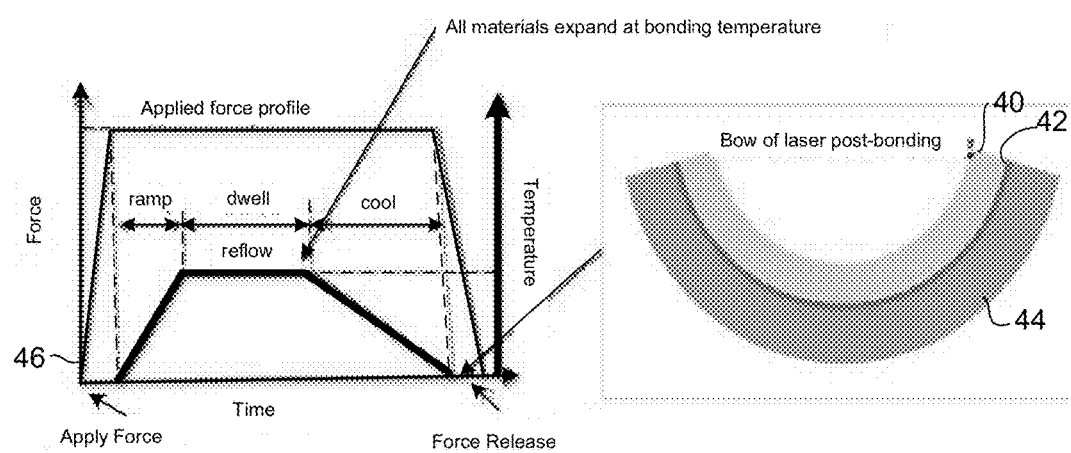
FIG. 4B shows forces applied to the layers of FIG. 4A during bonding and the resulting bowing of the assembly post-bonding.
Figure 4C:
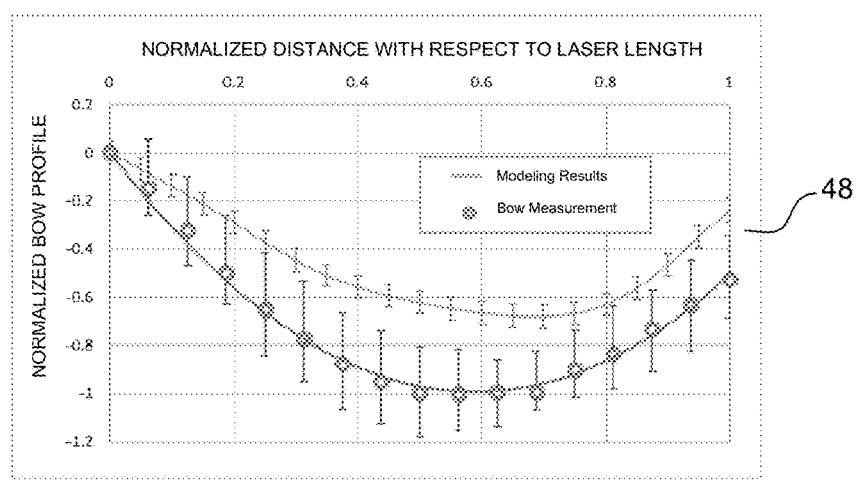
FIG. 4C is a graph comparing modeling results of laser bowing to bow measurements.

FIGS. 4A-4C illustrate the impact of bonding and resulting bowing on the laser 40 and submount 44. In this example, an InP laser 40 is bonded to an Si submount 44 with AuSn solder 42 (eutectic temperature 280° C.) (FIG. 4A). The laser and submount materials expand at bonding temperatures as shown by the dotted lines in FIG. 4A. When the assembly is cooled to room temperature post-bonding, the laser die bows due to the CTE mismatch of the materials in the laser assembly, as shown in FIG. 4B. Graph 46 of FIG. 4B illustrates forces and temperature changes over time during the bonding process. The bow distorts the laser grating, which results in the phase shift of the optical output. The pre-distorted grating shown in FIG. 3B compensates for the changes in grating pitch caused by the bowing, thereby preventing laser kink or multimode operation.

FIG. 4C is a graph illustrating the amount of bowing along the length of the grating according to modeling results and actual bow measurements. The graph shows that the model predicts laser bow profiles that correlate well with the measured laser bow. The model predicts that the longitudinal strain on the laser grating (as shown in FIG. 3A) is related to submount material and increases with laser cavity length.

Figure 5:
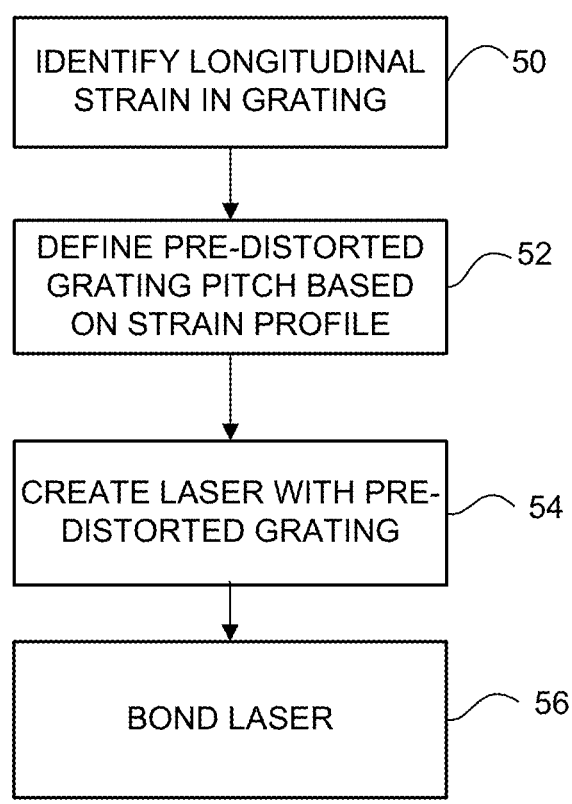
FIG. 5 is a flowchart illustrating an overview of a process for creating a laser with a pre-distorted grating, in accordance with one embodiment.

FIG. 5 is a flowchart illustrating an overview of a process for creating pre-distorted gratings for semiconductor lasers. At step 50, a longitudinal strain profile for the grating is identified (e.g., as shown in FIG. 3A). As previously described, the longitudinal strain in the grating may be obtained from FEA simulation, DOP measurements, or any other suitable means. A pre-distorted grating pitch (grating pitch profile, pitch variation) is defined for the length of the grating based on the stain profile (step 52). For example, as shown in FIG. 3B, the grating pitch may be reduced at a central portion exhibiting higher strain as compared to end portions, as shown in FIG. 3A. The laser is then manufactured with the pre-distorted grating (step 54) and bonded onto the carrier (submount) as shown in FIG. 1 (step 56). The resulting grating will have a generally uniform pitch as shown in FIG. 3C, after the grating has experienced bowing post-bonding (after heating and cooling).

It is to be understood that the flowchart shown in FIG. 5 is only an example and that steps may be added, combined, removed, or modified, without departing from the scope of the embodiments.

Figure 6:
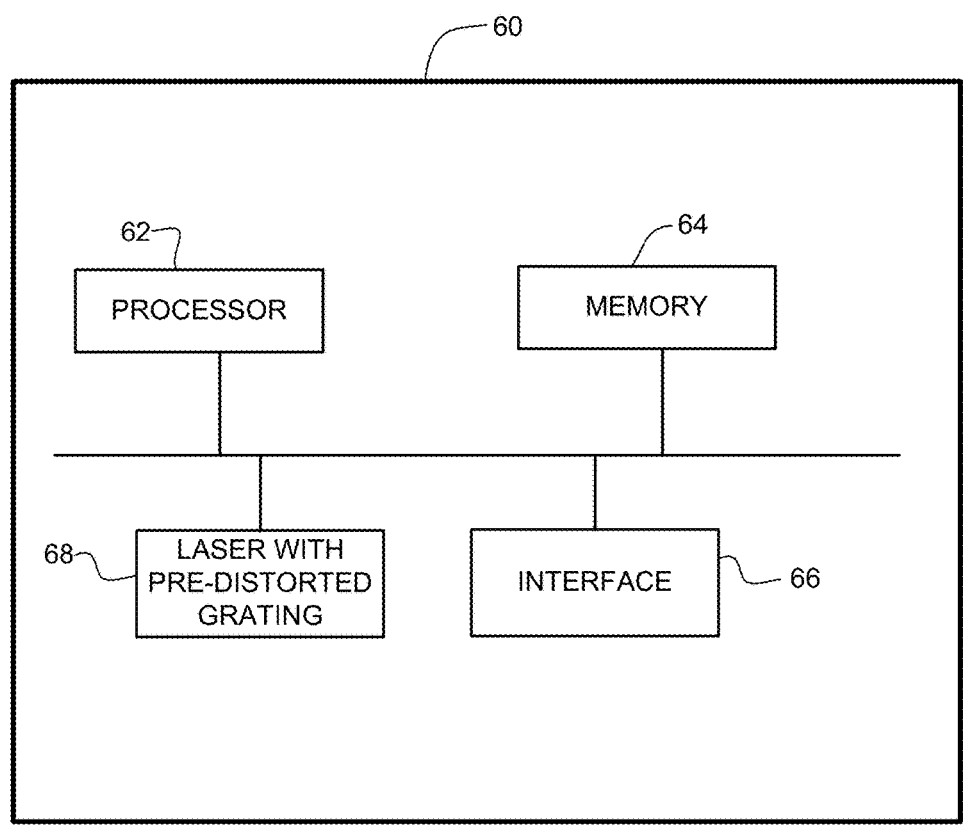
FIG. 6 illustrates an example of a computer in which the embodiments described herein may be implemented.

The embodiments described herein may operate in the context of a computer (network device, optical communication device, laptop, desktop, mobile device, phone, tablet, IoT device, etc.) as shown in the block diagram of FIG. 6. In one embodiment, the computer 60 is a programmable machine that may be implemented in hardware, software, or any combination thereof. The computer 60 includes one or more processor 62, memory 64, network interface (port) 66, and laser with pre-distorted grating 68.

Memory 64 may be a volatile memory or non-volatile storage, which stores various applications, operating systems, modules, and data for execution and use by the processor 62. The computer 60 may include any number of memory components.

Logic may be encoded in one or more tangible media for execution by the processor 62. For example, the processor 62 may execute codes stored in a computer-readable medium such as memory 64. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The processor 62 may process data received from the interface 66. The computer 60 may include any number of processors 62.

The network interface 66 may comprise any number of interfaces (linecards, ports) for receiving data or transmitting data to other devices. The network interface 66 may include, for example, an Ethernet interface for connection to a computer or network or a wireless interface.

It is to be understood that the computer 60 shown in the block diagram of FIG. 6 and described above is only an example and that the embodiments described herein may be implemented in different configurations of computing (electronic, network) devices. For example, the computer 60 may further include any suitable combination of hardware, software, algorithms, processors, devices, components, or elements.

Although the apparatus and method have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
    a carrier; and
    a semiconductor laser bonded to the carrier, the semiconductor laser comprising a grating extending longitudinally along the semiconductor laser;
    wherein the grating is pre-distorted to vary a pitch of the grating according to a longitudinal strain profile of the grating to compensate for bonding induced stress such that the grating has a uniform pitch following bonding of the laser to the carrier.

2. The apparatus of claim 1 wherein the laser comprises a distributed feedback laser.

3. The apparatus of claim 1 wherein the laser comprises an InP laser mounted on an AlN carrier.

4. The apparatus of claim 1 wherein the laser comprises an InP laser mounted on an Si carrier.

5. The apparatus of claim 1 wherein the laser is bonded to the carrier with an AuSn solder.

6. The apparatus of claim 1 wherein the uniform pitch is defined for different sections of a phase-shifted laser grating.

7. The apparatus of claim 1 wherein the longitudinal strain profile is identified using finite element analysis simulation or degree of polarization-resolved photoluminescence measurements.

8. The apparatus of claim 1 wherein the pitch varies between a central section of the grating and end portions of the grating.

9. The apparatus of claim 1 wherein the pre-distorted grating comprises a central portion with a reduced pitch.

10. A method comprising:
identifying a longitudinal strain profile of a grating for a laser and carrier assembly;
defining a pitch variation for the grating to compensate for a strain identified in the longitudinal strain profile;
creating a pre-distorted grating according to the defined pitch variation; and
bonding the laser to the carrier;
wherein the bonded laser and carrier assembly comprise a grating with a uniform grating pitch.

11. The method of claim 10 wherein the laser comprises a distributed feedback laser.

12. The method of claim 10 wherein the laser comprises an InP laser mounted on an AlN carrier.

13. The method of claim 10 wherein the laser comprises an InP laser mounted on an Si carrier.

14. The method of claim 10 wherein the laser is bonded to the carrier with an AuSn solder.

15. The method of claim 10 wherein the longitudinal strain profile is identified using finite element analysis simulation or degree of polarization-resolved photoluminescence measurements.

16. The method of claim 10 wherein the uniform pitch is defined for different sections of a phase-shifted laser grating.

17. The method of claim 10 wherein the pitch varies between a central section of the grating and end portions of the grating.

18. The method of claim 10 wherein the pre-distorted grating comprises a central portion with a reduced pitch.

19. A distributed feedback laser comprising:
a plurality of layers; and
a grating defined in one of said layers and extending longitudinally along the distributed feedback laser;
wherein the grating is pre-distorted to vary a grating pitch according to a longitudinal strain profile of the grating to compensate for bonding induced stress such that the grating has a uniform pitch following bonding of the laser.

20. The distributed feedback laser of claim 19 wherein the distributed feedback laser is bonded to a carrier.

* * * * *